United States Patent
Kamiyama et al.

(10) Patent No.: US 6,943,052 B2
(45) Date of Patent: Sep. 13, 2005

(54) METHOD OF MANUFACTURING DISPLAY APPARATUS

(75) Inventors: Isao Kamiyama, Kanagawa (JP); Shoji Terada, Kanagawa (JP)

(73) Assignee: Sony Corporation, Tokyo (JP)

( * ) Notice: Subject to any disclaimer, the term of this patent is extended or adjusted under 35 U.S.C. 154(b) by 93 days.

(21) Appl. No.: 10/725,308

(22) Filed: Dec. 1, 2003

(65) Prior Publication Data

US 2005/0054137 A1 Mar. 10, 2005

(30) Foreign Application Priority Data

Dec. 3, 2002 (JP) .................................... P2002-350640

(51) Int. Cl.$^7$ .............................................. H01L 21/00
(52) U.S. Cl. .............................. 438/59; 438/20; 438/30; 438/29; 438/149; 438/148; 438/753; 438/756
(58) Field of Search .......................... 438/59, 30, 20, 438/29, 149, 710, 753, 756, 148, 155, 161, 694, 745, 778, 704, 724, 734, 757, 785

(56) References Cited

U.S. PATENT DOCUMENTS

| | | | | |
|---|---|---|---|---|
| 5,675,212 A | * | 10/1997 | Schmid et al. | 313/422 |
| 6,355,125 B1 | * | 3/2002 | Tahon et al. | 156/99 |
| 6,476,886 B2 | * | 11/2002 | Krusius et al. | 349/73 |
| 6,603,191 B2 | * | 8/2003 | Wakabayashi et al. | 257/620 |
| 6,819,041 B2 | * | 11/2004 | Kajiwara | 313/496 |
| 6,867,841 B2 | * | 3/2005 | Nakasu et al. | 349/187 |
| 2005/0074954 A1 | * | 4/2005 | Yamanaka | 438/458 |

* cited by examiner

Primary Examiner—B. William Baumeister
Assistant Examiner—Igwe U. Anya
(74) Attorney, Agent, or Firm—Sonnenschein, Nath & Rosenthal LLP (57) ABSTRACT

A support substrate having the same size as a device substrate provided with alignment marks is disposed opposite to and adhered to the back side of the device substrate. At least the face side of the device substrate on the support substrate is cut at division lines along a functional region. An organic film is formed on the functional region of the device substrate thus cut. The support substrate is cut along the functional region of the device substrate, thereby removing peripheral portions of the support substrate and the device substrate, to form a display panel. Positioning of the substrate relative to a manufacturing apparatus for each step can be performed with high accuracy, in the manufacturing process including a step of cutting the substrate to a smaller size in the course of manufacture.

4 Claims, 6 Drawing Sheets

METHOD OF MANUFACTURING DISPLAY APPARATUS

RELATED APPLICATION DATA

The present application claims priority to Japanese Application(s) No(s). P2002-350640 filed Dec. 3, 2002, which application(s) is/are incorporated herein by reference to the extent permitted by law.

BACKGROUND OF THE INVENTION

The present invention relates to a method of manufacturing a display apparatus using organic electroluminescence devices.

An organic electroluminescence (hereinafter referred to as EL) device utilizing the EL of an organic material comprises an organic layer sandwiched between an anode and a cathode. In the organic EL device with such a constitution, positive holes injected from the anode and electrons injected from the cathodes are recoupled with each other to emit light, which is taken out as emission light on the cathode or anode side. The organic EL device has drawn attention as a light-emitting device capable of emitting light at a high luminance of several hundred to several tens of thousand candelas per square meters under a low driving voltage of not more than 10 V. In addition, in the case of the organic EL devices, light-emitting devices for emitting light in each of different colors can be obtained by selecting the material of the organic layer, and, by arranging the light-emitting devices for emitting light in the individual colors in a predetermined condition, it is possible to constitute a display apparatus capable of multi-color display or full-color display.

Meanwhile, for enlarging the screen of the display apparatus using organic EL devices, there has been known a technology of constructing a single large display screen by joining a plurality of small-sized panels in a two-dimensional manner (see, for example, Japanese Patent Laid-open No. 2002-55634 (p. 5)). In this case, for realizing a high-definition display screen, it is required to reduce as much as possible the distance between the pixels at the joined portions (joints) so as to render the joints inconspicuous. Generally, however, it is difficult to form patterns such as pixel circuits, wirings, pixel electrodes and an organic film in an area ranging to end faces of the substrate.

In view of this, in a method of manufacturing a display apparatus by joining small-sized panels together, first, the patterns such as pixel circuits, wirings, pixel electrodes and an organic film are formed on a substrate larger than the small-sized panel for constituting the large screen, then the portions near the end faces for joining are cut with high accuracy by a substrate cutting apparatus such as a laser cutter and a dicing apparatus, and the small-sized panels thus obtained are arranged and joined to each other, thereby constituting a single large display screen.

In the case of constituting a single display screen (large screen) by joining together a plurality of small-sized panels as above-mentioned, however, it is necessary to make the distance between the pixles at the joints equal to the distance between the pixels at other portions, in order to render the joints between the panels as inconspicuous as possible. Therefore, the distance from a cut end face at an opening end of the display area to a pixel end is very short, so that the use of a substrate cutting apparatus such as a laser cutter and a dicing apparatus causes damage to the organic film portion in the display area.

In order to prevent this trouble, it is necessary to follow the procedure of cutting the substrate, provided with the pixel circuits, wirings and pixel electrodes, before the formation of the organic film to obtain the small-sized panel, thereafter forming the organic layer, a counter electrode and further a protective film on each small-sized panel, and then arranging the small-sized panels and joining them together. However, when such a procedure is followed, alignment marks normally arranged in the peripheral area are removed by the cutting of the substrate. Therefore, in the steps after the cutting of the substrate, it is impossible to position the substrate relative to a manufacturing apparatus with high accuracy. To obviate this problem, it is necessary to form the alignment marks in portions which are not removed by the cutting. In this case, however, it is necessary to prepare a special manufacturing apparatus, to modify the specifications of the manufacturing apparatuses, and so on, which causes a rise in manufacturing cost.

SUMMARY OF THE INVENTION

Accordingly, it is an object of the present invention to provide a method of manufacturing a display apparatus which makes it possible to cut a substrate without damaging members present on the substrate and to position the substrate relative to a manufacturing apparatus for each step with high accuracy, in the case of a manufacturing process including a step of cutting the substrate to a smaller size in the course of manufacture.

In order to attain the above object, according to the present invention, there is provided a method of manufacturing a display apparatus in which, first, in a first step, a support substrate having roughly the same shape as a device substrate provided with alignment marks is disposed opposite to the back side of the device substrate, and the substrates are adhered to each other. Next, in a second step, at least the face side of the device substrate is cut along a functional region set in a central area, in the condition where individual divisional portions of the device substrate are left on the support substrate. Thereafter, in a third step, an organic film is formed on the functional region of the device substrate thus cut. Subsequently, in a fourth step, the support substrate is cut along the functional region of the device substrate, thereby removing peripheral portions of the support substrate and the device substrate, to form a display panel.

In the method of manufacturing a display apparatus as above-mentioned, at least the face side of the device substrate on the support substrate is cut in the condition where the individual divisional portions of the device substrate are left on the support substrate, the alignment marks provided on the device substrate are left as they are on the support substrate, together with the functional region of the device substrate cut off and separated from the periphery. Therefore, in forming the organic film in the next third step, positioning is conducted by using directly the alignment marks provided on the device substrate whose size is the same as its size before cutting. Besides, in the case of removing the peripheral portions of the support substrate and the device substrate by cutting the support substrate in the subsequent fourth step, the cutting of the support substrate does not affect the organic film formed in the functional region of the device substrate having been cut, so that the quality of the organic film is maintained.

Thus, according to the method of manufacturing a display apparatus according to the present invention, it is possible to reduce the size of the substrate without damaging the organic film on the substrate and to position the substrate relative to a manufacturing apparatus for each step with high accuracy, in the case where the substrate is cut to a smaller size in the course of manufacture. As a result, in addition, it is unnecessary to prepare a special manufacturing apparatus in correspondence with the small-sized substrate, which makes it possible to reduce the manufacturing cost of the display apparatus included of the small-sized substrates (display panels) joined together. Furthermore, it is possible to secure versatility of the manufacturing apparatuses, independently of the substrate size.

BRIEF DESCRIPTION OF THE DRAWINGS

The above and other objects, features and advantages of the present invention will become apparent from the following description and appended claims, taken in conjunction with the accompanying drawings, wherein:

DETAILED DESCRIPTION OF THE PREFERRED EMBODIMENTS

Now, as an embodiment of the method of manufacturing a display apparatus according to the present invention, a method of manufacturing a display apparatus having a display portion comprised of an array of organic EL devices will be described in detail below referring to the drawings.

FIGS. 1A to 1E are sectional process charts illustrating the manufacturing method according to the embodiment, and FIGS. 2 to 6 are plan-view process charts for illustrating the manufacturing method according to the embodiment, which correspond to FIGS. 1A to 1E, respectively. Here, the manufacturing method according to the embodiment will be described referring to FIGS. 1A to 1E and FIGS. 2 to 6. Incidentally, FIGS. 1A to 1E correspond to section A—A' of the plan views in FIGS. 2 to 6.

Figure 1A:
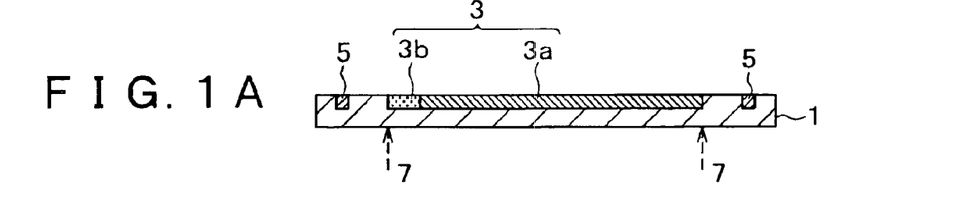
FIGS. 1A to 1E are sectional process charts for illustrating a manufacturing method according to one embodiment of the present invention.
Figure 2:
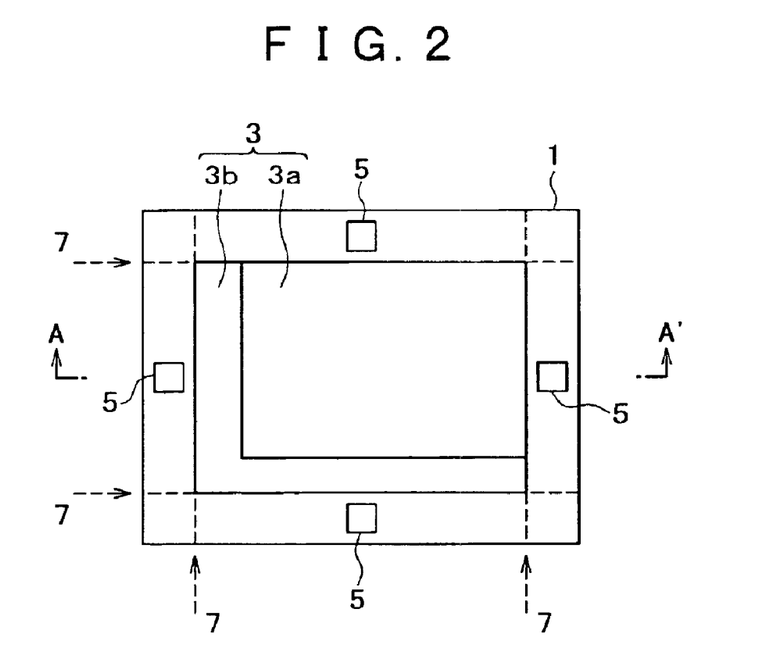
FIG. 2 is a plan view (No. 1) for illustrating a manufacturing step according to the embodiment.

First, as shown in FIG. 1A and FIG. 2, a device substrate 1 is prepared. The device substrate 1 has a functional region 3 set in the center thereof. The functional region 3 is provided with a display area 3a whose size is ¼ times the size of a display panel for constituting the display apparatus to be manufactured, and a peripheral circuit area 3b surrounding contiguous two sides of the display area 3a.

The device substrate 1 is provided with alignment marks 5 to be used for positioning the device substrate 1 relative to each of a plurality of manufacturing apparatuses used in the subsequent steps. The alignment marks 5 are used in common for the manufacturing apparatuses; therefore, the alignment marks 5 are located at predetermined positions on the device substrate 1, and, normally, they are formed in the peripheral area of the substrate 1, namely, on the outside of the functional region 3.

It is assumed here that, on the device substrate 1, division lines 7 are set at positions along the functional region 3. The division lines are the positions at which the device substrate 1 is to be cut in a later step, and are set along perimetrical ends of the functional region 3. It is also assumed that, where the cutting of the device substrate 1 is conducted by use of a dicing apparatus, four division lines 7 are set along the whole length and the whole width of the device substrate 1, as shown in FIG. 2.

In addition, the functional region 3 of the device substrate 1 has been subjected to preparatory treatments for forming organic EL devices such as provision of pixel circuits using thin film transistors (TFT), wirings, pixel electrodes (for example, anodes), etc. which are not shown in the figures.

Figure 1B:
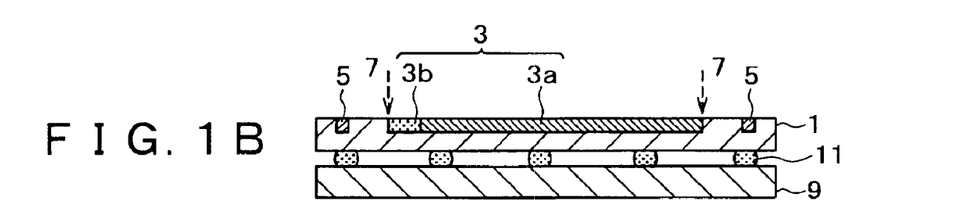
Figure 3:
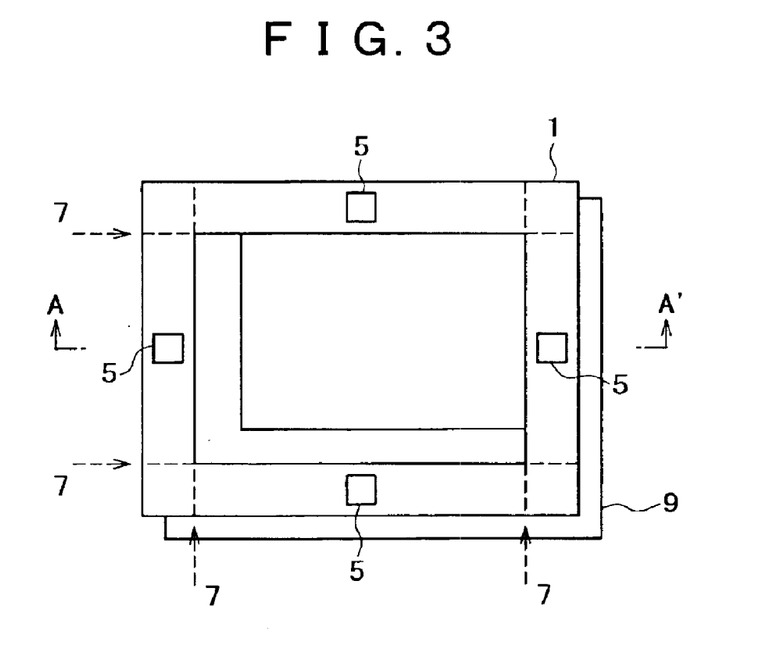
FIG. 3 is a plan view (No. 2) for illustrating a manufacturing step according to the embodiment.

Next, as shown in FIG. 1B and FIG. 3, a support substrate 9 is adhered to the back side (the side where the pixel electrodes and the like are not formed) of the device substrate 1. The support substrate 9 has roughly the same shape as the device substrate 1, and is formed of a material having a sufficient strength and capable of being divided, for example, a material the same or similar to that of the device substrate (a 0.7 mm thick glass substrate for TFT). The support substrate 9 is disposed opposite to the back side of the device substrate 1, and is adhered to the device substrate 1 in the manner of not projecting outwards from the perimeter of the device substrate 1.

In addition, the adhesion of the device substrate 1 and the support substrate 9 to each other is conducted through an adhesive 11 (omitted in FIG. 3). The adhesive 11 is deposited between the device substrate 1 and the support substrate 9 at positions avoiding the division lines 7 set on the device substrate 1. As a result, the device substrate 1 and the support substrate 9 are adhered to each other with the adhesive 11 deposited therebetween in regions avoiding the division lines 7 so that the portions between the device substrate 1 and the support substrate 9 corresponding to the division lines 7 are hollow. In this case, the adhesion through the adhesive 11 is conducted on both sides of each of the division lines 7 so that the portions, corresponding to the areas where the alignment marks 5 are formed, of the device substrate 1 are also adhered to the support substrate 9.

As the adhesive 11, there may be used a material having sufficiently high adhesion strength, heat resistance and corrosion resistance, being low in hygroscopicity, being less susceptible to deformation, and showing little outgassing. For example, a low temperature curable type epoxy-based adhesive may be used.

Figure 1C:
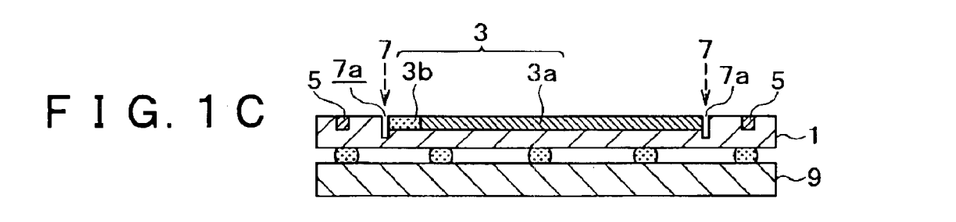
Figure 4:
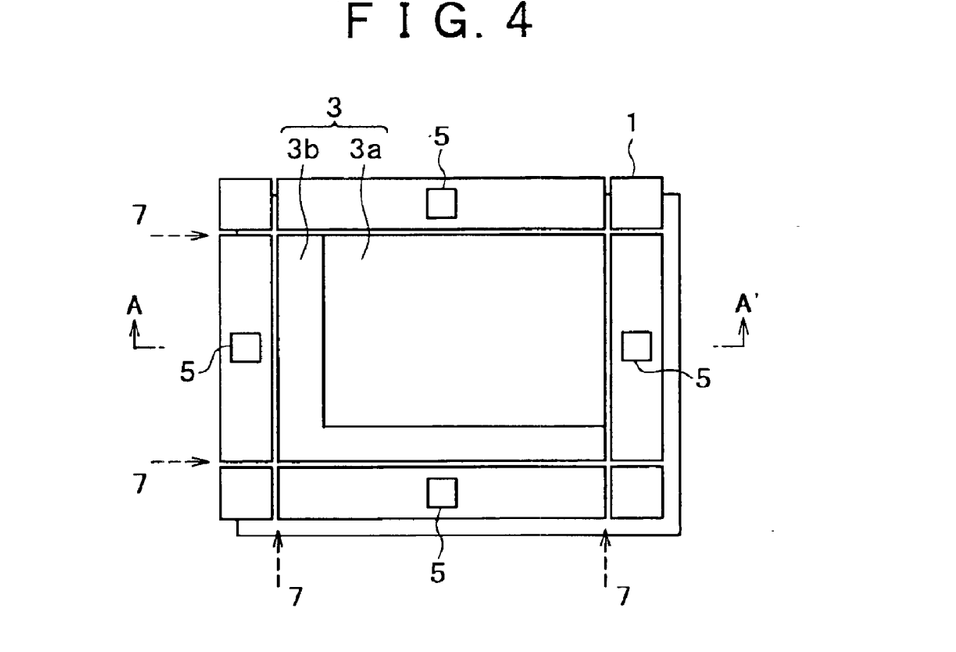
FIG. 4 is a plan view (No. 3) for illustrating a manufacturing step according to the embodiment.

Subsequently, as shown in FIG. 1C and FIG. 4, the device substrate 1 is cut at the division lines 7, to separate only the functional region 3. In this case, it is unnecessary to divide the device substrate 1 completely, and the functional region 3 may be separated from and cut off from the peripheral regions by forming cut grooves 7a along the division lines 7 from the face side of the device substrate 1 by use of a dicing apparatus. Besides, in the case of dividing the device substrate 1 completely, it is important to leave both the functional region 3 and the other divisional portions (particularly the portions where the alignment marks 5 are formed) of the device substrate 1 on the support substrate 9 by cutting only the device substrate 1 on the support substrate 9.

Incidentally, it should be noted that, at the time of cutting the device substrate 1 in the above-mentioned manner, the cutting conditions are so set that the divisional portions of the device substrate 1 are restrained from moving relative to the support substrate 9 and that the divisional portions of the device substrate 1 are not damaged.

Figure 1D:
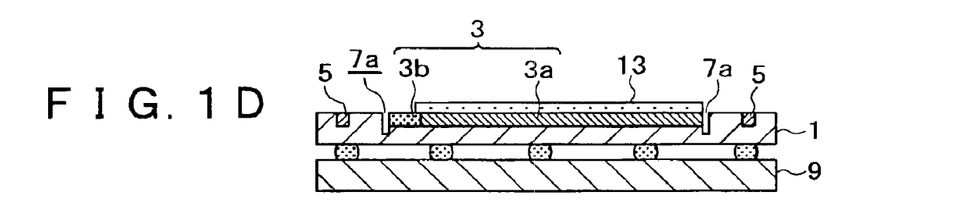
Figure 5:
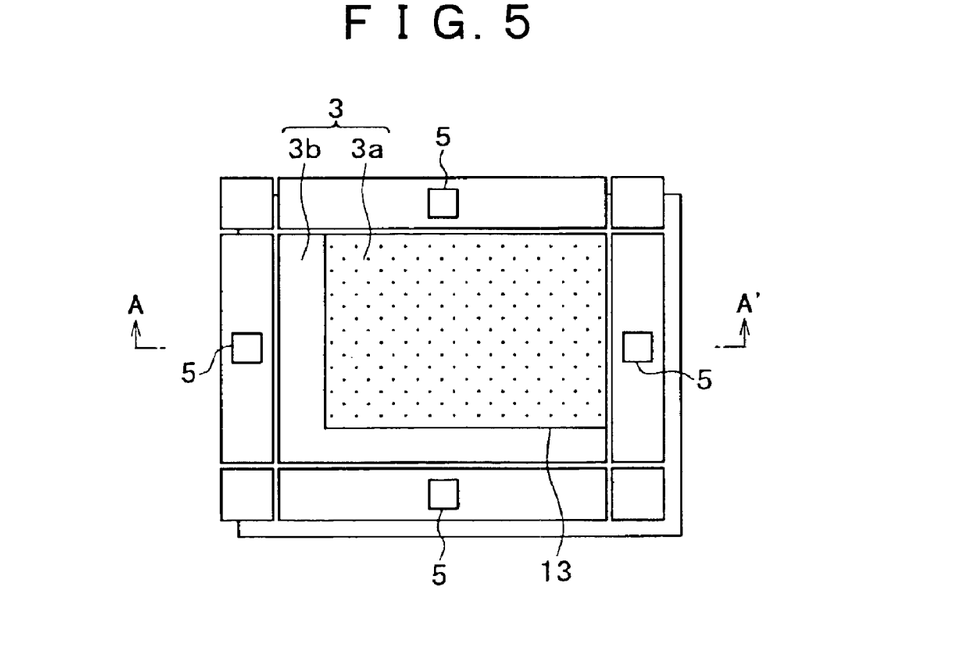
FIG. 5 is a plan view (No. 4) for illustrating a manufacturing step according to the embodiment.

Thereafter, as shown in FIG. 1D and FIG. 5, an organic film 13 is formed on the display portion 3a in the functional region 3 of the device substrate 1 thus cut (provided with the cut grooves 7a), and, further, upper electrodes (for example, cathodes) are formed on the functional region 3 provided thereon with the organic film 13, to complete organic EL devices in the display portion 3a in the functional region 3. Thereafter, a protective film is formed, as required. In each of these forming steps, positioning of the device substrate 1 by use of the alignment marks 5 is conducted on each manufacturing apparatus.

Figure 1E:
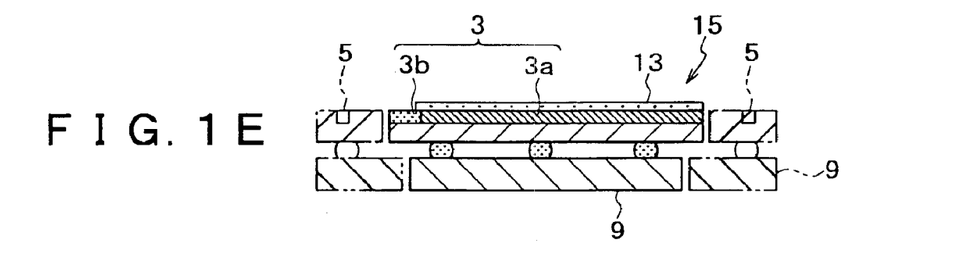
Figure 6:
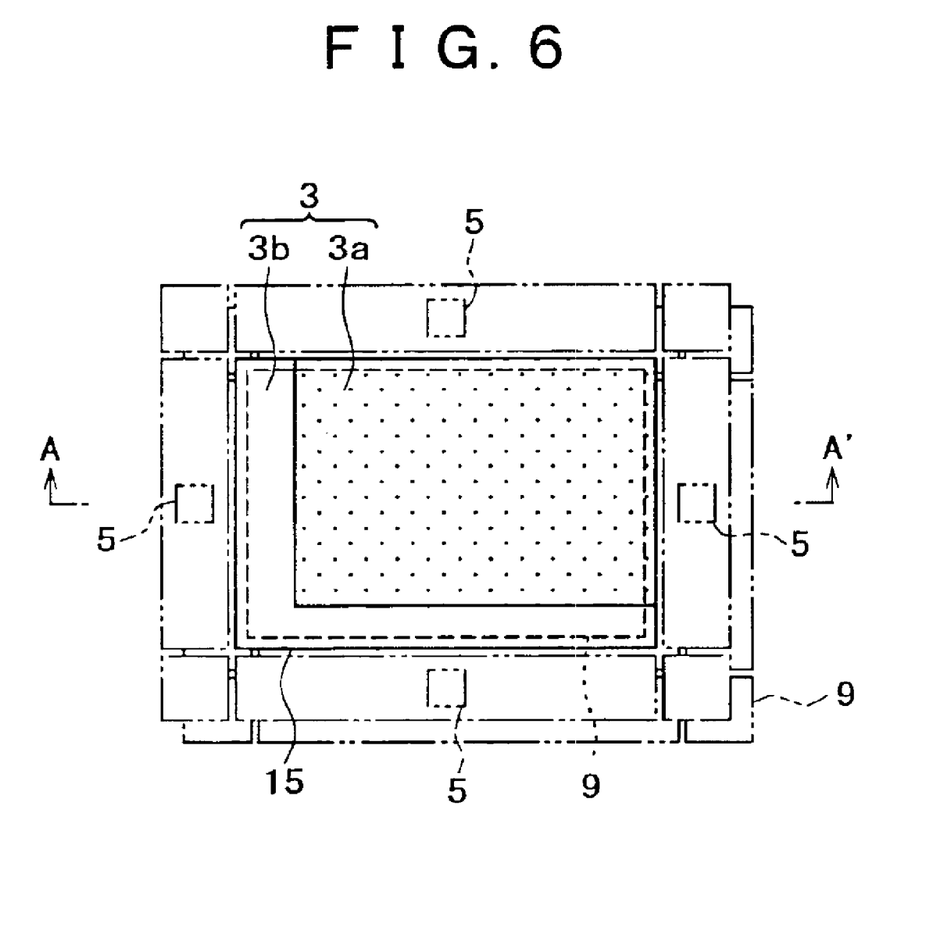
FIG. 6 is a plan view (No. 5) for illustrating a manufacturing step according to the embodiment.

Next, as shown in FIG. 1E and FIG. 6, first, where the device substrate 1 is provided with the cut grooves 7a, scribe breaking is conducted to completely dividing the device substrate 1 along the cut grooves 7a. In this condition, all the divisional portions of the device substrate 1 are fixed on the support substrate 9.

Then, the support substrate 9 is cut along the functional region 3. By this, the peripheral portions (the portions where the alignment marks 5 are formed) of the support substrate 9 and the device substrate 1 are removed, to form a small-sized display panel 15. In the cutting of the support substrate 9, it is preferable to cut the support substrate 9 on the inner side of the perimeter of the functional region 3 of the device substrate 1 so that the support substrate 9 left upon the cutting does not project outwards from the device substrate 1 left in the display panel 15 (namely, the functional region 3).

Subsequently, the small-sized display panels 15 formed as above-mentioned are joined together.

Figure 7:
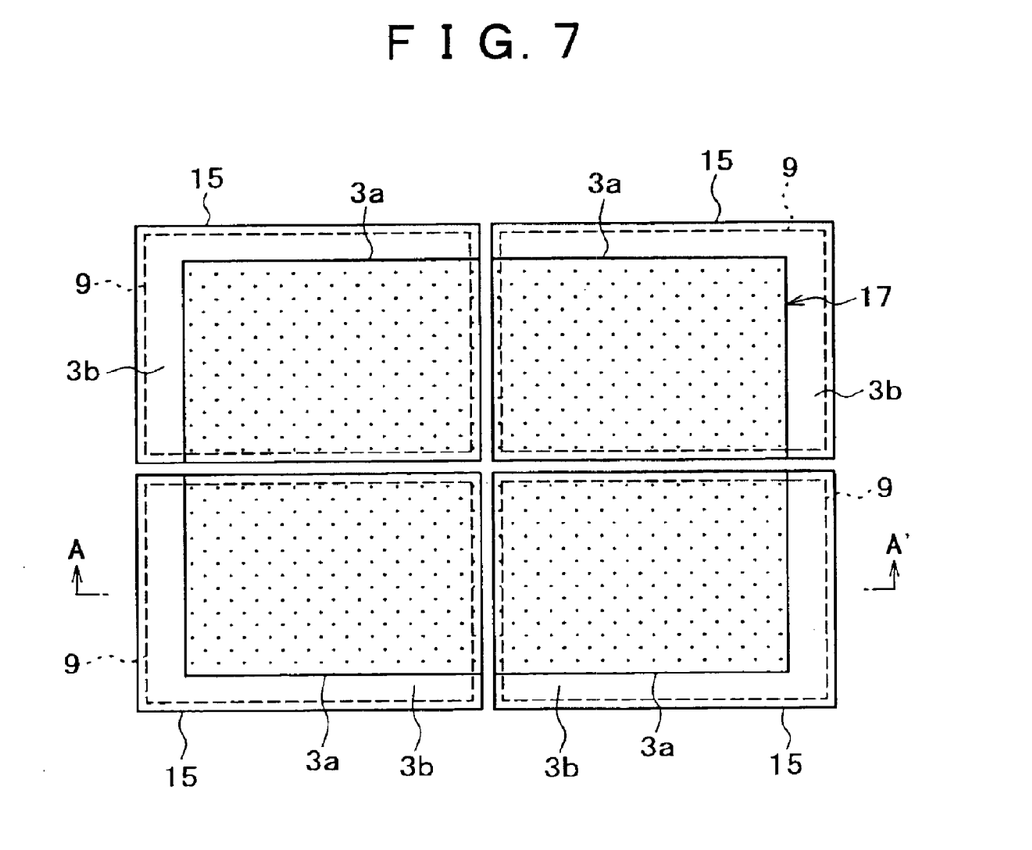
FIG. 7 is a plan view (No. 6) for illustrating a manufacturing step according to the embodiment.

In this case, first, four display panels 15 are so disposed that the cut faces on the sides of the display portions 3a thereof abut on each other, as shown in the plan view of FIG. 7. In this condition, the four display panels 15 are so disposed as to set the interval between the display portions 3a so that the pixel pitch at the divisional portions is equal to that at the other portions. In this case, in each of the display panels 15, the support substrate 9 is divided to be smaller than the device substrate 1, and, therefore, such a disposition as above is not hampered by the support substrate 9.

With the four display panels 15 disposed as above-mentioned, a single large-sized display screen 17 is formed of the four display portions 3a of these display panels 15. The display screen 17 is surrounded by the peripheral circuit portions 3b.

Figure 8:
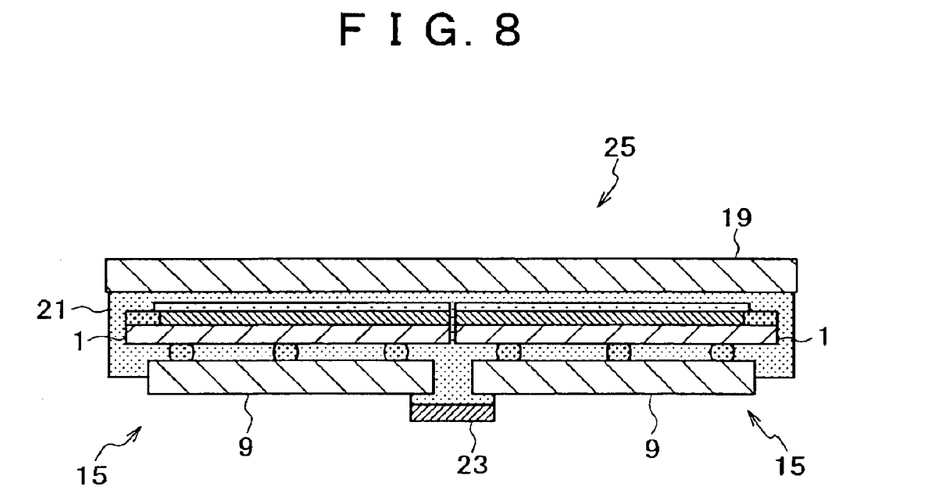
FIG. 8 is a sectional view for illustrating a manufacturing step according to the embodiment.

Next, as shown in FIG. 8, a sealing substrate 19 is disposed opposite to the side of the device substrates 1 of the display panels 15 disposed as shown in FIG. 7, and the four display panels 15 (only two of them are shown in FIG. 8) are fixed by adhering them to the sealing substrate 19 through a sealing agent 21.

Where the display apparatus being manufactured here is of the type in which light is taken out on the side of the sealing substrate 19, the sealing substrate 19 and the sealing agent 21 are each composed of a light-transmitting material. In this case, though omitted in the figures, the sealing substrate 19 may be provided with a black matrix in such a manner that portions of the black matrix are located between the organic EL devices formed in the small-sized display panels 15.

Besides, the sealing agent 21 is preferably charged into the joint portions (the gaps between the display panels 15) of the small-sized display panels 15 attached to the sealing substrate 19; furthermore, the sealing agent 21 may be charged into the gap between the device substrate 1 and the support substrate 9 of each of the display panels 15.

Subsequently, plate-like members 23 may be adhered to the side of the display panels 15 through the sealing agent 21 so as to cover the joint portions of the small-sized display panels 15, as required. By the above steps, a display apparatus 25 comprising the single large-sized display screen 17 (see FIG. 7) is completed.

Incidentally, the plate-like members 23 may be so shaped as to cover the joint portions of the display panels 15, or may be so shaped as to cover the entire surfaces of the support substrates 9 of the display panels 15 inclusive of the joint portions. When the plate-like members 23 are formed of a material having high heat conductivity (for example, a metal such as aluminum), heat generated in each display panel 15 can be efficiently released to the exterior through the plate-like members 23. In addition, where the display apparatus 25 is of the type in which display light is taken out on the side of the sealing substrate 19, the surfaces of the plate-like members 23 may be made black or black-based in color by, for example, a blackening treatment, whereby the light entering the display apparatus 25 from the side of the sealing substrate 19 can be prevented from being scattered.

According to the above-described manufacturing method, as has been described referring to FIG. 1C and FIG. 4, the face side of the device substrate 1 is cut in the condition where the divisional portions of the device substrate 1 are left on the support substrate 9, so that the alignment marks 5 provided on the device substrate 1 are left as they are on the support substrate 9 together with the functional region 3 of the device substrate 1 having been cut off and separated from the surroundings. Therefore, as has been described referring to FIG. 1D and FIG. 5, in forming the organic film 13 and the upper electrodes, positioning can be conducted by using directly the alignment marks 5 provided on the device substrate 1 having the same size as the size before cutting. In addition, in the subsequent step described referring to FIG. 1E and FIG. 6, in the case of removing the peripheral portions of the support substrate 9 and the device substrate 1 by cutting the support substrate 9, the cutting of the support substrate 9 does not affect the organic film 13 formed on the functional region 3 of the device substrate 1 having already been cut, and the quality of the organic film 13 is maintained.

Therefore, in the case of cutting the device substrate 1 to a smaller size in the course of manufacture, the reduction in size can be achieved without damaging the organic film 13 on the device substrate 1, and positioning of the device substrate 1 relative to a manufacturing apparatus for each step can be performed with high accuracy.

Accordingly, after the reduction in size by cutting the device substrate 1, it is unnecessary to prepare a special manufacturing apparatus in correspondence with the small-sized device substrate 1, to modify the specifications of manufacturing devices in correspondence with the small-sized device substrate 1, or to prepare special manufacturing apparatuses for this purpose. Thus, it is possible to reduce the manufacturing cost of the display apparatus 25 comprised of the small-sized display panels 15 joined together. In addition, it is possible to secure versatility of the manufacturing apparatuses, independently of the substrate size.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of manufacturing a display apparatus, comprising:
   a first step of disposing a support substrate opposite to the back side of a device substrate provided with alignment marks and adhering said substrates to each other, said support substrate having roughly the same shape as said device substrate;
   a second step of cutting at least the face side of said device substrate along a functional region set in a central area on said face side, in the condition where individual divisional portions of said device substrate are left on said support substrate;
   a third step of forming an organic film on said functional region of said device substrate thus cut; and
   a fourth step of cutting said support substrate along said functional region of said device substrate, thereby removing peripheral portions of said support substrate and said device substrate, to form a display panel.

2. A method of manufacturing a display apparatus as set forth in claim 1, wherein
   in said first step, said device substrate and said support substrate are adhered to each other with an adhesive therebetween, in a region avoiding the cut portion along said functional region.

3. A method of manufacturing a display apparatus as set forth in claim 1, wherein
   a plurality of said display panels are joined to each other so as thereby to form a single display screen.

4. A method of manufacturing a display apparatus as set forth in claim 3, wherein
   in said fourth step, said support substrate is cut on the inner side of the perimeter of said functional region of said device substrate.

* * * * *